US012751318B2

(12) United States Patent
Inoue

(10) Patent No.: US 12,751,318 B2
(45) Date of Patent: Sep. 29, 2026

(54) SEMICONDUCTOR MODULE

(71) Applicant: FUJI ELECTRIC CO., LTD., Kawasaki (JP)

(72) Inventor: Daisuke Inoue, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 134 days.

(21) Appl. No.: 17/973,941

(22) Filed: Oct. 26, 2022

(65) Prior Publication Data

US 2023/0187292 A1 Jun. 15, 2023

(30) Foreign Application Priority Data

Dec. 10, 2021 (JP) ................................ 2021-200547

(51) Int. Cl.
*H10W 76/153* (2026.01)
*H05K 7/14* (2006.01)
*H05K 7/20* (2006.01)

(52) U.S. Cl.
CPC ........ *H10W 76/153* (2026.01); *H05K 7/1432* (2013.01); *H05K 7/20927* (2013.01)

(58) Field of Classification Search
CPC ....... H01L 23/055; H01L 23/10; H01L 23/02; H01L 23/04; H01L 23/473; H01L 25/072;
(Continued)

(56) References Cited

U.S. PATENT DOCUMENTS

| | | | | |
|---|---|---|---|---|
| 9,888,601 B2 * | 2/2018 | Jones | ...................... | H05K 7/02 |
| 12,009,279 B2 | 6/2024 | Sato | | |

(Continued)

FOREIGN PATENT DOCUMENTS

| | | |
|---|---|---|
| JP | 50-122861 U | 10/1975 |
| JP | 7-237708 A | 9/1995 |

(Continued)

OTHER PUBLICATIONS

Murayama_English, murayama translation (Year: 2020).*
(Continued)

*Primary Examiner* — Minsun O Harvey
*Assistant Examiner* — Alexander Ehrlich

(57) ABSTRACT

There is provided a semiconductor module that can reduce the assembly tolerance between a case part and a base part. A semiconductor module includes: a base part having a plurality of semiconductor elements and a cooling unit configured to cool the plurality of semiconductor elements; a case part attached to the base part and defining a space in which the plurality of semiconductor elements is disposed; a first protruding portion having a shape in which a dimension in a first direction passing through a center of the first protruding portion and a dimension in a second direction crossing the first direction and passing through the center differ from each other, the first protruding portion protruding from the case part toward a side on which the base part is disposed; and a through-hole having an opening being larger than an outer periphery of the first protruding portion and following a shape of the outer periphery of the first protruding portion, wherein the through-hole is formed to pass through the base part and the first protruding portion is inserted into the through-hole.

10 Claims, 5 Drawing Sheets

(58) Field of Classification Search
CPC ............. H05K 7/1432; H05K 7/20927; H05K 7/14329
See application file for complete search history.

(56) References Cited

U.S. PATENT DOCUMENTS

| | | | |
|---|---|---|---|
| 12,424,510 | B2 | 9/2025 | Sato |
| 2021/0050277 | A1 | 2/2021 | Sato |
| 2024/0258194 | A1 | 8/2024 | Sato |

FOREIGN PATENT DOCUMENTS

| | | | | | |
|---|---|---|---|---|---|
| JP | 9-172274 | A | | 6/1997 | |
| JP | 2001102438 | A | * | 4/2001 | |
| JP | 2002-118369 | A | | 4/2002 | |
| JP | 2020174159 | A | * | 10/2020 | ......... H01L 21/4817 |
| WO | WO-2010090092 | A1 | * | 8/2010 | ............ B60L 15/007 |
| WO | 2020/071058 | A1 | | 4/2020 | |

OTHER PUBLICATIONS

Suzuki_English, suzuki translation (Year: 2010).*
Yoshiaki_English, yoshiaki translation (Year: 2001).*
Office Action dated Oct. 28, 2025 for the corresponding Japanese Application No. 2021-200547.

* cited by examiner

SEMICONDUCTOR MODULE

CROSS-REFERENCE TO RELATED APPLICATIONS

This application is based upon and claims the benefit of priority from the prior Japanese Patent Application No. 2021-200547, filed on Dec. 10, 2021, the entire contents of which are incorporated herein by reference.

TECHNICAL FIELD

The present invention relates to a semiconductor module applied to power converters and the like.

BACKGROUND ART

PTL 1 discloses a precision substrate storage container in which a container body storing precision substrates is closed in a sealed state by fitting a lid to an open end face of the container body. In this precision substrate storage container, a pair of positioning recesses is provided at an interval from each other on the surface of the lid, and at least one of the pair of positioning recesses is formed as an elongated hole having a long axis on a line connecting the pair of positioning recesses.

PTL 2 discloses a semiconductor module having a configuration in which a case is formed with vertically aligned upper and lower adjustment pins, and the upper adjustment pins determine the position of a subassembly, while the lower adjustment pins determine the position of another subassembly.

When assembling a semiconductor module having an insulated gate bipolar transistor (IGBT) and the like, a plurality of assembly parts (e.g., a base part and a case part) need to be attached to each other. When two or more subassemblies are attached to each other in a semiconductor module, tolerances of the individual assemblies are added. Consequently, a problem arises that there is a possibility that a further subassembly cannot be attached or may be difficult to attach.

CITATION LIST

Patent Literature

PTL 1: JP 2001-102438 A
PTL 2: U.S. Pat. No. 9,888,601

SUMMARY OF INVENTION

Technical Problem

Against the problem that the tolerances of the assemblies are added, measures are generally taken to reduce the assembly tolerance by combining a plurality of assembly parts using a jig pin as a reference. However, with this method, tolerances of the assembly parts are added with tolerances with respect to the jig pin and further with assembly tolerances between each of the assembly parts and the other assembly parts. Therefore, the conventional technology has a problem that there is a possibility that the tolerances of the assembly parts increase as the number of the assembly parts increase, resulting in an increase in the size of the assembly parts.

Further, when the tolerances of the assembly parts are reduced in order to avoid the increase in the size of the assembly parts, there is a possibility that a problem occurs that while the assembly parts can be positioned with respect to the jig pin, the assembly work of the assembly parts becomes complicated, or the assembly parts cannot be assembled to each other. This problem is prone to occur when manufacturers that manufacture the assembly parts are different.

It is an object of the present invention to provide a semiconductor module that can reduce the assembly tolerance between a case part and a base part as assembly parts.

Solution to Problem

In order to achieve the object described above, a semiconductor module according to an aspect of the present invention includes: a base part having a plurality of semiconductor elements and a cooling unit configured to cool the plurality of semiconductor elements; a case part attached to the base part and defining a space in which the plurality of semiconductor elements is disposed; a first protruding portion having a shape in which a dimension in a first direction passing through a center of the first protruding portion and a dimension in a second direction crossing the first direction and passing through the center differ from each other, the first protruding portion protruding from the case part toward a side on which the base part is disposed; and a through-hole having an opening being larger than an outer periphery of the first protruding portion and following a shape of the outer periphery of the first protruding portion, wherein the through-hole is formed to pass through the base part and the first protruding portion is inserted into the through-hole.

Advantageous Effects of Invention

According to the aspect of the present invention, it is possible to reduce the assembly tolerance between a case part and a base part as assembly parts.

DESCRIPTION OF EMBODIMENTS

Embodiments of the present invention merely exemplify devices and methods for embodying the technical idea of the present invention. The technical idea of the present invention does not limit materials, shapes, structures, arrangements, and the like of constituent parts to those described below. The technical idea of the present invention can be changed in various ways within the technical scope defined by the claims.

(Entire Configuration of Semiconductor Module)

Figure 1:
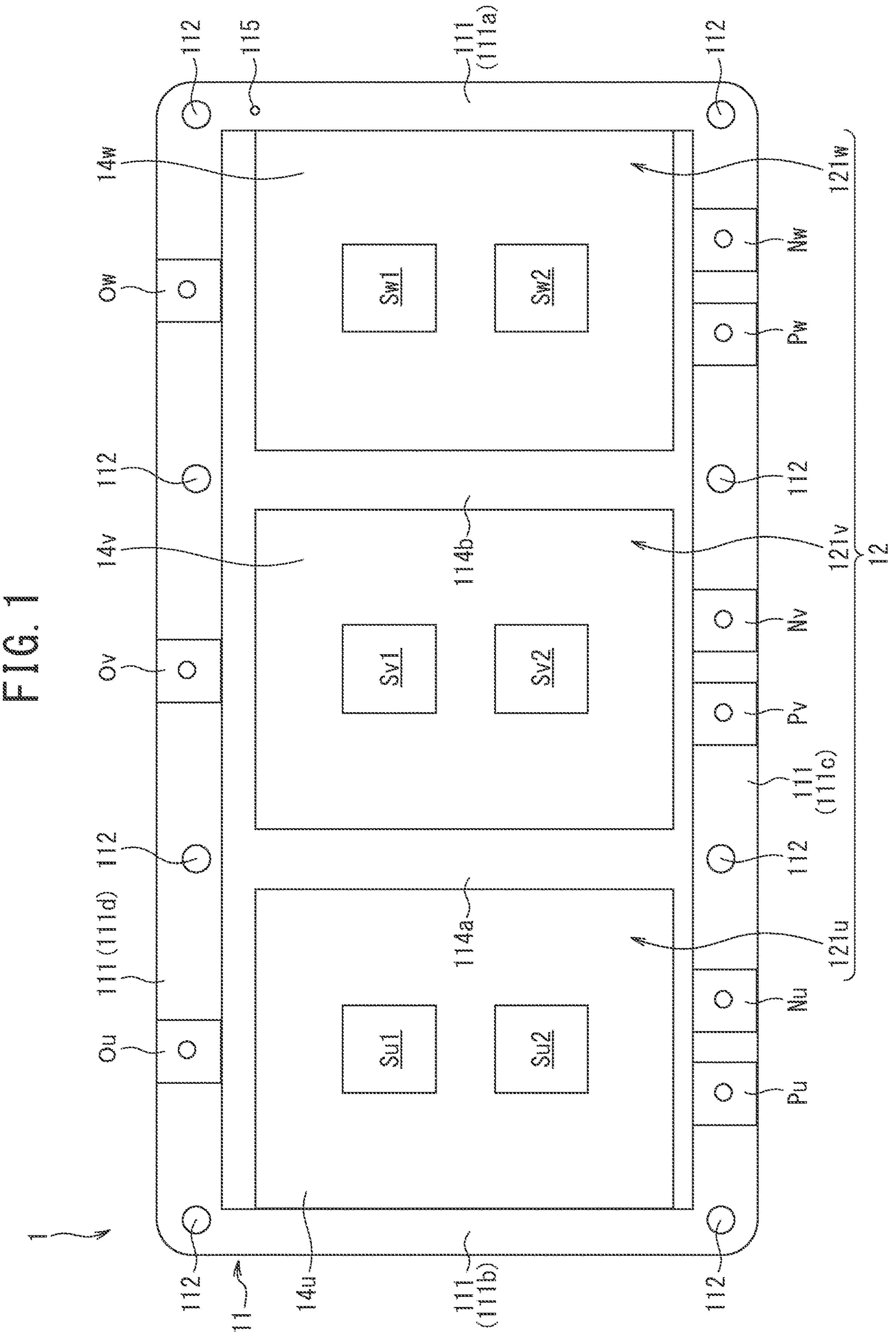
FIG. 1 is a diagram illustrating one example of a schematic configuration of a semiconductor module according to an embodiment of the present invention and is a plan view of the semiconductor module as viewed from the case part side.

A semiconductor module according to an embodiment of the present invention will be described with reference to FIGS. 1 to 5B. First, the schematic configuration of the semiconductor module according to this embodiment will be described with reference to FIGS. 1 to 4. In this embodiment, a power conversion module capable of direct current-alternating current (DC-AC) conversion will be described as an example of the semiconductor module. In FIG. 1, the illustration of a sealing resin provided in the semiconductor module is omitted.

Figure 2:
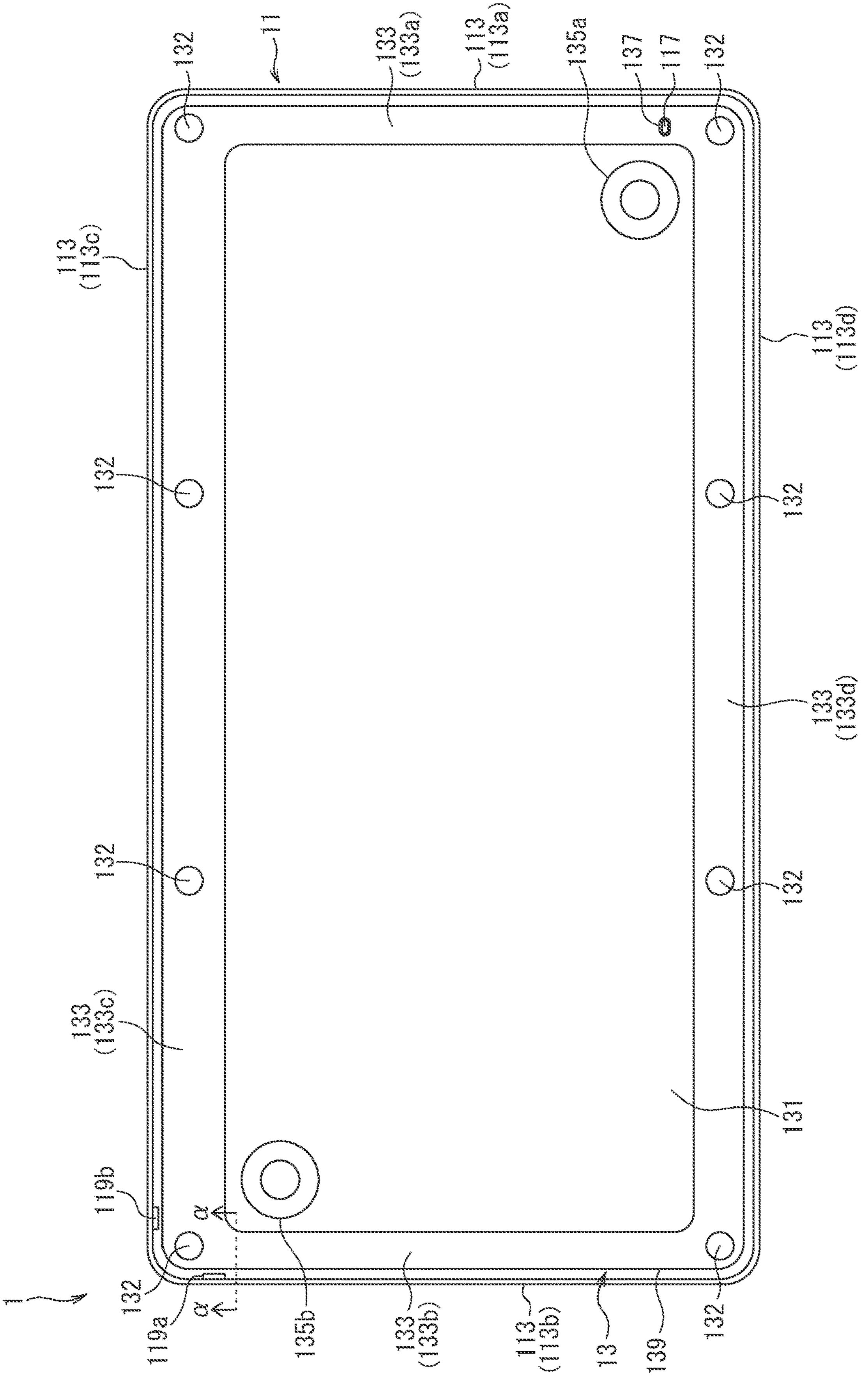
FIG. 2 is a diagram illustrating one example of a schematic configuration of the semiconductor module according to the embodiment of the present invention and is a bottom view of the semiconductor module as viewed from the base part side.

As illustrated in FIGS. 1 and 2, a semiconductor module 1 according to this embodiment includes a base part 13 (see FIG. 2) having a plurality of (six in this embodiment) semiconductor elements Su1, Su2, Sv1, Sv2, Sw1, Sw2 (see FIG. 1) and a cooling unit 131 (see FIG. 2) for cooling the semiconductor elements Su1, Su2, Sv1, Sv2, Sw1, Sw2. Hereinafter, "Su1, Su2, Sv1, Sv2, Sw1, Sw2" will sometimes be abbreviated as "Su1 to Sw2". As illustrated in FIG. 1, the semiconductor module 1 further includes a case part 11 that is attached to the base part 13 (not illustrated in FIG. 1) and defines a space 12 in which the semiconductor elements Su1 to Sw2 are disposed. Although the details will be described later, as illustrated in FIG. 2, the semiconductor module 1 includes a first protruding portion 117 formed in the case part 11, second protruding portions 119*a*, 119*b* formed in the case part 11, and a through-hole 137 which is formed in the base part 13 and into which the first protruding portion 117 is inserted.

The semiconductor elements Su1, Su2 are switching elements constituting a U-phase inverter circuit. The semiconductor elements Sv1, Sv2 are switching elements constituting a V-phase inverter circuit. The semiconductor elements Sw1, Sw2 are switching elements constituting a W-phase inverter circuit.

As illustrated in FIG. 1, the case part 11 has a peripheral portion 111 formed in a rectangular frame shape. Consequently, the case part 11 has a rectangular external shape. Specifically, the case part 11 has a rectangular external shape as viewed in the axial direction of board mounting holes 112 (the details will be described later), i.e., as viewed in plan view. The case part 11 has a partition 114*a* dividing a part of the space 12 into a U-phase space 121*u* and a V-phase space 121*v*, and a partition 114*b* dividing the remaining part of the space 12 into the V-phase space 121*v* and a W-phase space 121*w*.

A U-phase laminated substrate 14*u* is disposed in the U-phase space 121*u*. The U-phase laminated substrate 14*u* is provided with the U-phase inverter circuit having the semiconductor elements Su1, Su2 and the like. A V-phase laminated substrate 14*v* is disposed in the V-phase space 121*v*. The V-phase laminated substrate 14*v* is provided with the V-phase inverter circuit having the semiconductor elements Sv1, Sv2 and the like. A W-phase laminated substrate 14*w* is disposed in the W-phase space 121*w*. The W-phase laminated substrate 14*w* is provided with the W-phase inverter circuit having the semiconductor elements Sw1, Sw2 and the like. The U-phase space 121*u* serves as a casting region into which a sealing resin (not illustrated) for sealing the U-phase laminated substrate 14*u* is cast. The V-phase space 121*v* serves as a casting region into which a sealing resin (not illustrated) for sealing the V-phase laminated substrate 14*v* is cast. The W-phase space 121*w* serves as a casting region into which a sealing resin (not illustrated) for sealing the W-phase laminated substrate 14*w* is cast. Consequently, the U-phase laminated substrate 14*u*, the V-phase laminated substrate 14*v*, and the W-phase laminated substrate 14*w* are respectively sealed by the sealing resin.

The peripheral portion 111 has a flat plate shape, for example. The peripheral portion 111 has a pair of short side portions 111*a*, 111*b* disposed to face each other, and a pair of long side portions 111*c*, 111*d* disposed to face each other and each extending between end portions of the short side portions 111*a*, 111*b*. In a region of the long side portion 111*c* corresponding to the U-phase space 121*u*, a positive electrode terminal Pu and a negative electrode terminal Nu to which DC power to be supplied to the semiconductor elements Su1, Su2 is applied are disposed. In a region of the long side portion 111*c* corresponding to the V-phase space 121*v*, a positive electrode terminal Pv and a negative electrode terminal Nv to which DC power to be supplied to the semiconductor elements Sv1, Sv2 is applied are disposed. In a region of the long side portion 111*c* corresponding to the W-phase space 121*w*, a positive electrode terminal Pw and a negative electrode terminal Nw to which DC power to be supplied to the semiconductor elements Sw1, Sw2 is applied are disposed.

In a region of the long side portion 111*d* corresponding to the U-phase space 121*u*, an output terminal Ou from which U-phase AC power generated by the U-phase inverter circuit is output is disposed. In a region of the long side portion 111*d* corresponding to the V-phase space 121*v*, an output terminal Ov from which V-phase AC power generated by the V-phase inverter circuit is output is disposed. In a region of the long side portion 111*d* corresponding to the W-phase space 121*w*, an output terminal Ow from which W-phase AC power generated by the W-phase inverter circuit is output is disposed.

The semiconductor module 1 has a columnar portion 115 protrusively disposed on the case part 11. The columnar portion 115 is disposed in the short side portion 111*a*. The columnar portion 115 is disposed near the long side portion 111*d*. The columnar portion 115 is used as a reference position for mounting to the case part 11 a circuit board (not illustrated) provided with a control circuit that controls the semiconductor elements Su1 to Sw2. The plurality of (eight in this embodiment) board mounting holes 112 is formed in the peripheral portion 111 of the case part 11. The board mounting holes 112 are used for mounting the circuit board to the case part 11 and the base part 13. The board mounting holes 112 are formed to pass through the peripheral portion 111.

As illustrated in FIG. 2, the case part 11 has a side wall 113 facing a side surface 139 of the base part 13. The side wall 113 is disposed to surround the base part 13. The side wall 113 is formed integrally with the peripheral portion 111. The side wall 113 is formed substantially perpendicular to a surface (a surface where the output terminals Ou, Ov, Ow, etc. are disposed) of the peripheral portion 111 and extends from an outer end portion of the peripheral portion 111.

The side wall 113 of the case part 11 has a pair of short side portions 113*a*, 113*b* disposed to face each other, and a pair of long side portions 113*c*, 113*d* disposed to face each other and each extending between end portions of the short side portions 113*a*, 113*b*. The case part 11 has the second protruding portions 119*a*, 119*b* protruding from the side wall 113 toward the side surface 139 of the base part 13. The second protruding portion 119*a* is formed on the short side portion 113*b* of the side wall 113. The second protruding portion 119*a* is formed on a surface of the short side portion 113*b* facing the side surface 139 of the base part 13. The second protruding portion 119*b* is formed on the long side portion 113*c* of the side wall 113. The second protruding portion 119*b* is formed on a surface of the long side portion 113*c* facing the side surface 139 of the base part 13. Specific structures of the second protruding portions 119*a*, 119*b* will be described later.

The peripheral portion 111, the partitions 114*a*, 114*b*, the columnar portion 115, and the side wall 113 constituting the case part 11 are formed integrally, for example. The case part 11 is made of an insulating thermoplastic resin, for example.

As illustrated in FIG. 2, the base part 13 has a rectangular external shape. Specifically, the base part 13 has a rectangular external shape as viewed in the axial direction of board mounting holes 132 (the details will be described later), i.e., as viewed in plan view. The base part 13 has the cooling unit 131 provided at a central portion, and a peripheral portion 133 disposed around the cooling unit 131 and facing the peripheral portion 111 of the case part 11.

The cooling unit 131 has a rectangular shape in plan view. The cooling unit 131 has a storage space 131*a* (not illustrated in FIG. 2, see FIG. 4) capable of storing a coolant (water in this embodiment). The base part 13 has inlet/outlet ports 135*a*, 135*b* respectively disposed at opposite two corners out of four corners of the cooling unit 131. The inlet/outlet ports 135*a*, 135*b* have a tubular shape. Inner spaces of the inlet/outlet ports 135*a*, 135*b* communicate with the storage space 131*a* of the cooling unit 131. Consequently, the coolant is allowed to flow into the storage space 131*a* of the cooling unit 131 through the inlet/outlet port 135*a*, for example, and the coolant in the storage space 131*a* is allowed to flow out to the outside through the inlet/outlet port 135*b*, for example.

The U-phase laminated substrate 14*u*, the V-phase laminated substrate 14*v*, and the W-phase laminated substrate 14*w* (see FIG. 1) are disposed in contact with a surface of the cooling unit 131 on the side where the case part 11 is disposed. The U-phase laminated substrate 14*u*, the V-phase laminated substrate 14*v*, and the W-phase laminated substrate 14*w* are disposed such that, for example, a heat transfer member (not illustrated) provided to face the cooling unit 131 is fixed to the cooling unit 131 by soldering. Consequently, the cooling unit 131 is able to prevent that the temperatures of the semiconductor elements Su1 to Sw2, the U-phase laminated substrate 14*u*, the V-phase laminated substrate 14*v*, and the W-phase laminated substrate 14*w* become higher than the rated temperatures due to the heat generated by the operation of the semiconductor elements Su1 to Sw2.

The peripheral portion 133 of the base part 13 has a flat plate shape, for example. The peripheral portion 133 has a pair of short side portions 133*a*, 133*b* disposed to face each other, and a pair of long side portions 133*c*, 133*d* disposed to face each other and each extending between end portions of the short side portions 133*a*, 133*b*. The short side portion 133*a* of the base part 13 is disposed to face and contact the short side portion 111*a* of the case part 11. The short side portion 133*b* of the base part 13 is disposed to face and contact the short side portion 111*b* of the case part 11. The long side portion 133*c* of the base part 13 is disposed to face and contact the long side portion 111*c* of the case part 11. The long side portion 133*d* of the base part 13 is disposed to face and contact the long side portion 111*d* of the case part 11.

The base part 13 has the side surface 139 facing the side wall 113 of the case part 11. The side surface 139 is a surface of a side end portion of the base part 13. The side surface 139 is formed a little smaller than the side wall 113 of the case part 11 and disposed along the side wall 113 on the inner peripheral side of the side wall 113. The side surface 139 is disposed with a predetermined gap from the side wall 113 of the case part 11. The second protruding portions 119*a*, 119*b* are disposed in this gap. The side surface 139 is also a surface of a side end portion of the peripheral portion 133. The side surface 139 is partially configured by a surface of a side end portion of the cooling unit 131.

The cooling unit 131 and the peripheral portion 133 are made of a material with a high thermal conductivity (e.g., aluminum). The case part 11 is fixed to the base part 13 by an adhesive, for example.

The plurality of (eight in this embodiment) board mounting holes 132 is formed in the peripheral portion 133 of the base part 13. The board mounting holes 132 are used for mounting the circuit board, provided with the control circuit that controls the semiconductor elements Su1 to Sw2, to the case part 11 and the base part 13. The board mounting holes 132 are formed to pass through the peripheral portion 133. The board mounting holes 132 are provided at positions that respectively overlap the arrangement positions of the board mounting holes 112 provided in the case part 11 when the case part 11 is attached to the base part 13. The circuit board is fixed to the semiconductor module 1 by inserting bolts into through-holes provided in the circuit board, the board mounting holes 112, and the board mounting holes 132 and then attaching nuts to the bolts from the base part 13 side.

As illustrated in FIG. 2, the semiconductor module 1 has the first protruding portion 117. The first protruding portion 117 has a shape in which the dimension in a first direction L1 (not illustrated in FIG. 2, see FIG. 3) passing through its center 117*a* (not illustrated in FIG. 2, see FIG. 3) and the dimension in a second direction L2 (not illustrated in FIG. 2, see FIG. 3) crossing the first direction L1 and passing through the center 117*a* differ from each other, and protrudes from the case part 11 toward the side where the base part 13 is disposed. The center 117*a* refers to the center of the first protruding portion 117 in plan view of the case part 11. In this embodiment, the first direction L1 and the second direction L2 are perpendicular to each other, for example, but may cross each other at a different angle. The semiconductor module 1 has the through-hole 137 having an opening that is larger than the outer periphery of the first protruding portion 117 and that follows the shape of the outer periphery of the first protruding portion 117. The through-hole 137 is formed to pass through the base part 13, and the first protruding portion 117 is inserted into the through-hole 137.

The first protruding portion 117 is disposed on the side of the short side portion 111*a* (an example of the side of one of the pair of short side portions) out of the pair of short side portions 111*a*, 111*b* (see FIG. 1) of the peripheral portion 111 provided in the case part 11. The second protruding portions 119*a*, 119*b* are disposed on the side of the short side portion 111*b* (an example of the side of the other of the pair of short side portions) out of the pair of short side portions 111*a*, 111*b* of the peripheral portion 111. Therefore, the through-hole 137 is formed in the short side portion 133*a* out of the pair of short side portions 133*a*, 133*b* of the peripheral portion 133 provided in the base part 13.

The first protruding portion 117 is disposed near the corner where the short side portion 111*a* and the long side portion 111*d* cross each other (an example of one corner), out of the four corners of the case part 11. Therefore, the through-hole 137 is formed near the corner where the short side portion 133*a* and the long side portion 133*d* cross each other, out of the four corners of the base part 13. The second protruding portions 119*a*, 119*b* are respectively disposed on the short side portion 113*b* out of the pair of short side portions 113*a*, 113*b* of the side wall 113 of the case part 11, and on the long side portion 113*c* out of the pair of long side portions 113*c*, 113*d* (an example of one of the pair of long side portions) of the side wall 113, such that the second protruding portions 119*a*, 119*b* sandwich the corner (the corner where the short side portion 111*b* and the long side portion 111*c* cross each other) located diagonally to the corner where the short side portion 111*a* and the long side portion 111*d* cross each other.

In the semiconductor module 1, in plan view of the case part 11 and the base part 13, the diagonally located corners of the side wall 113 of the case part 11 are at positions farthest from each other. Therefore, the first protruding portion 117/the through-hole 137 and the second protruding portions 119*a*, 119*b* are disposed in the vicinities of the positions farthest from each other in the semiconductor module 1 in plan view of the base part 13.

The first protruding portion 117 and the through-hole 137 are used for positioning when attaching the case part 11 to the base part 13. The through-hole 137 has the opening larger than the external shape of the first protruding portion 117. Therefore, when attaching the case part 11 to the base part 13, there is a possibility that the case part 11 rotates using the first protruding portion 117 as a rotational axis in the plane of the peripheral portion 111 formed with the first protruding portion 117. The rotation amount due to this rotation is minimum in the vicinity of the first protruding portion 117 and becomes maximum at the corner located diagonally to the corner of the case part 11 provided with the first protruding portion 117 (i.e., the corner where the short side portion 113*b* and the long side portion 113*c* of the side wall 113 cross each other). The semiconductor module 1 includes the second protruding portion 119*a* formed on the short side portion 113*b* and the second protruding portion 119*b* formed on the long side portion 113*c*. Therefore, when attaching the case part 11 to the base part 13, even when the case part 11 slightly rotates with respect to the base part 13 using the first protruding portion 117 as the rotational axis, the second protruding portion 119*a* comes in contact with the side surface 139 of the base part 13 or the second protruding portion 119*b* comes in contact with the side surface 139 of the base part 13. Consequently, the rotation of the case part 11 with respect to the base part 13 is prevented, and therefore, it is possible to improve the attaching accuracy and the attaching work efficiency of the case part 11 with respect to the base part 13.

The first protruding portion 117 and the columnar portion 115 are disposed in a substantially straight line so as to sandwich the peripheral portion 133 provided in the base part 13 and the peripheral portion 111 provided in the case part 11. Consequently, the first protruding portion 117 and the columnar portion 115 are disposed substantially coaxially. The first protruding portion 117 serves as a reference when attaching the case part 11 to the base part 13, and the columnar portion 115 serves as a reference when attaching the circuit board to the semiconductor module 1. Therefore, the semiconductor module 1 is able to concentrate various attaching references within a predetermined region.

(Configurations of First Protruding Portion, Second Protruding Portions, and Through-Hole)

Figure 3:
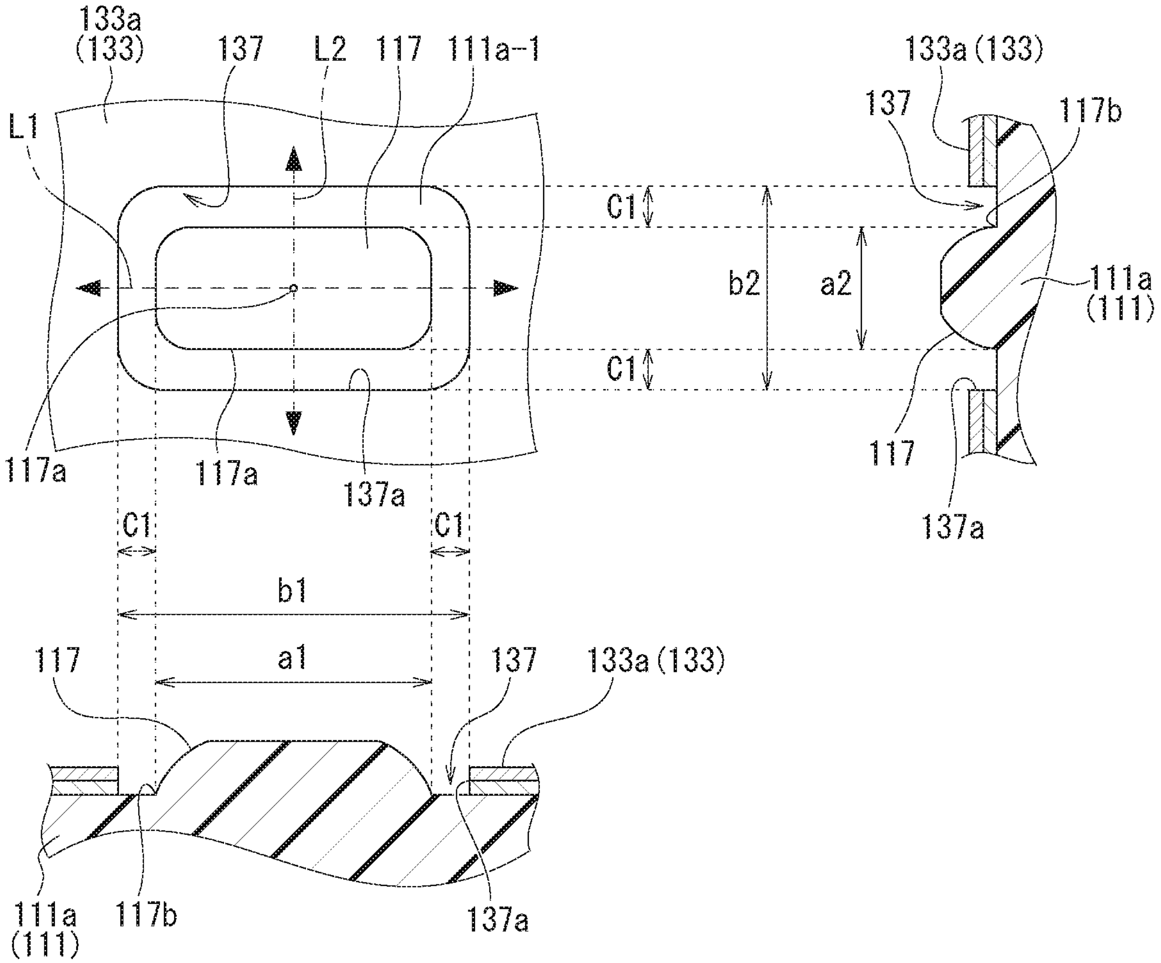
FIG. 3 is a diagram illustrating on an enlarged scale the vicinity of a first protruding portion provided in the semiconductor module according to the embodiment of the present invention.

Next, the schematic configurations of the first protruding portion 117, the second protruding portions 119*a*, 119*b*, and the through-hole 137 included in the semiconductor module 1 according to this embodiment will be described by way of example with reference to FIGS. 3 and 4 while also referring to FIGS. 1 and 2. First, the schematic configurations of the first protruding portion 117 and the through-hole 137 will be described with reference to FIG. 3. FIG. 3 is a diagram illustrating on an enlarged scale the vicinity of the first protruding portion 117 and the through-hole 137. On the upper left in FIG. 3, a plan view of the first protruding portion 117 and the through-hole 137 is illustrated. On the lower left in FIG. 3, a sectional view of the first protruding portion 117 and the through-hole 137 taken along the first direction L1 is illustrated. On the right in FIG. 3, a sectional view of the first protruding portion 117 and the through-hole 137 taken along the second direction L2 is illustrated.

As illustrated in FIG. 3, the first protruding portion 117 is formed integrally with the short side portion 111*a* of the peripheral portion 111 provided in the case part 11. The first protruding portion 117 is formed on a surface 111*a*-1 of the short side portion 111*a* facing the short side portion 133*a* of the peripheral portion 133 provided in the base part 13. The first protruding portion 117 is formed to protrude from the surface 111*a*-1. The first protruding portion 117 is formed such that its height from the surface 111*a*-1 as a reference is higher than the short side portion 133*a*.

The first protruding portion 117 has a rectangular parallelepiped shape with a surface formed as a curved surface. In this embodiment, the first direction L1 is set in the longitudinal direction of the first protruding portion 117, for example, and the second direction L2 is set in the lateral direction of the first protruding portion 117, for example. Therefore, the first protruding portion 117 has a shape in which the dimension in the first direction L1 is longer than the dimension in the second direction L2, and is disposed with the first direction L1 extending along the longitudinal direction of the base part 13. In other words, the first protruding portion 117 is disposed with the first direction L1 extending along the longitudinal direction of the case part 11. In this embodiment, the center 117*a* of the first protruding portion 117 is set at the center of the first protruding portion 117 as viewed in a direction perpendicular to the surface 111*a*-1 (i.e., in plan view).

As illustrated in FIG. 3, the through-hole 137 has an opening large enough to surround the first protruding portion 117 when the case part 11 is attached to the base part 13. The through-hole 137 has a shape that follows the outer peripheral shape of the first protruding portion 117. Therefore, the through-hole 137 has an elongated hole shape in plan view. In this way, the first protruding portion 117 has the shape (the rectangular parallelepiped shape in this embodiment) in which the dimensions in the first direction L1 and the second direction L2 differ from each other, and the through-hole 137 has the shape (the elongated hole shape in this embodiment) that follows the outer peripheral shape of the first protruding portion 117, so that the case part 11 is difficult to rotate using the first protruding portion 117 as the rotational axis when attaching the case part 11 to the base part 13.

In the semiconductor module 1, the first protruding portion 117 is used as a reference for positioning the case part 11 and the base part 13 when attaching the case part 11 to the base part 13. It is assumed that a reference value (i.e., a design value) of the dimension of the first protruding portion 117 in the first direction L1 is given by "a1" and that a reference value (i.e., a design value) of the dimension of the through-hole 137 in the first direction L1 is given by "b1". As illustrated in FIG. 3, when the dimension of the first protruding portion 117 and the dimension of the through-hole 137 are respectively the reference values and the first protruding portion 117 is disposed at the center of the through-hole 137, a cumulative tolerance T1 in the first direction L1 in the semiconductor module 1 can be expressed by a formula (1) below.

$$T1=a1-b1 \tag{1}$$

It is assumed that a reference value (i.e., a design value) of the dimension of the first protruding portion 117 in the second direction L2 is given by "a2" and that a reference value (i.e., a design value) of the dimension of the through-hole 137 in the second direction L2 is given by "b2". As illustrated in FIG. 3, when the dimension of the first protruding portion 117 and the dimension of the through-hole 137 are respectively the reference values and the first protruding portion 117 is disposed at the center of the through-hole 137, a cumulative tolerance T2 in the second direction L2 in the semiconductor module 1 can be expressed by a formula (2) below.

$$T2=a2-b2 \tag{2}$$

It is assumed that an upper allowable deviation and a lower allowable deviation of the reference value a1 of the dimension of the first protruding portion 117 in the first direction L1 are respectively given by "Δa1". It is assumed that an upper allowable deviation and a lower allowable deviation of the reference value b1 of the dimension of the through-hole 137 in the first direction L1 are respectively given by "Δb1". The relative position of the base part 13 and the case part 11 deviates most from a reference state in the first direction L1 when the dimension of the case part 11 in the first direction L1 becomes minimum and the dimension of the base part 13 in the first direction L1 becomes maximum. Herein, the reference state is the state illustrated in FIG. 3, i.e., the state where the first protruding portion 117 is disposed at the center of the through-hole 137 in plan view. Therefore, in the semiconductor module 1, a maximum deviation of the case part 11 and the base part 13 in the first direction L1, i.e., a maximum cumulative tolerance T1*n*, can be expressed by a formula (3) below.

$$\begin{aligned} T1n &= (b1+\Delta b1)-(a1-\Delta a1) \\ &= (b1-a1)+(\Delta b1+\Delta a1) \end{aligned} \tag{3}$$

It is assumed that an upper allowable deviation and a lower allowable deviation of the reference value a2 of the dimension of the first protruding portion 117 in the second direction L2 are respectively given by "Δa2". It is assumed that an upper allowable deviation and a lower allowable deviation of the reference value b2 of the dimension of the through-hole 137 in the second direction L2 are respectively given by "Δb2". The relative position of the base part 13 and the case part 11 deviates most from the reference state in the second direction L2 when the dimension of the case part 11 in the second direction L2 becomes minimum and the dimension of the base part 13 in the second direction L2 becomes maximum. Therefore, in the semiconductor module 1, a maximum cumulative tolerance T2*n* in the second direction L2 can be expressed by a formula (4) below.

$$\begin{aligned} T2n &= (b2+\Delta b2)-(a2-\Delta a2) \\ &= (b2-a2)+(\Delta b2+\Delta a2) \end{aligned} \tag{4}$$

As shown by the formulas (1) to (4), in the semiconductor module 1 according to this embodiment, the dimensions of the first protruding portion 117 formed in the case part 11 and the through-hole 137 formed in the base part 13 affect the cumulative tolerances on the positional deviation of the case part 11 and the base part 13.

Next, the configurations of the second protruding portions 119*a*, 119*b* will be described with reference to FIG. 4. The second protruding portion 119*a* and the second protruding portion 119*b* have the same configuration. Therefore, the configurations of the second protruding portion 119*a* and the second protruding portion 119*b* will be described using the second protruding portion 119*a* as an example. FIG. 4 is a diagram illustrating the second protruding portion 119*a* on an enlarged scale, and is a sectional view of a part of the semiconductor module 1 taken along the α-α line illustrated in FIG. 2.

Figure 4:
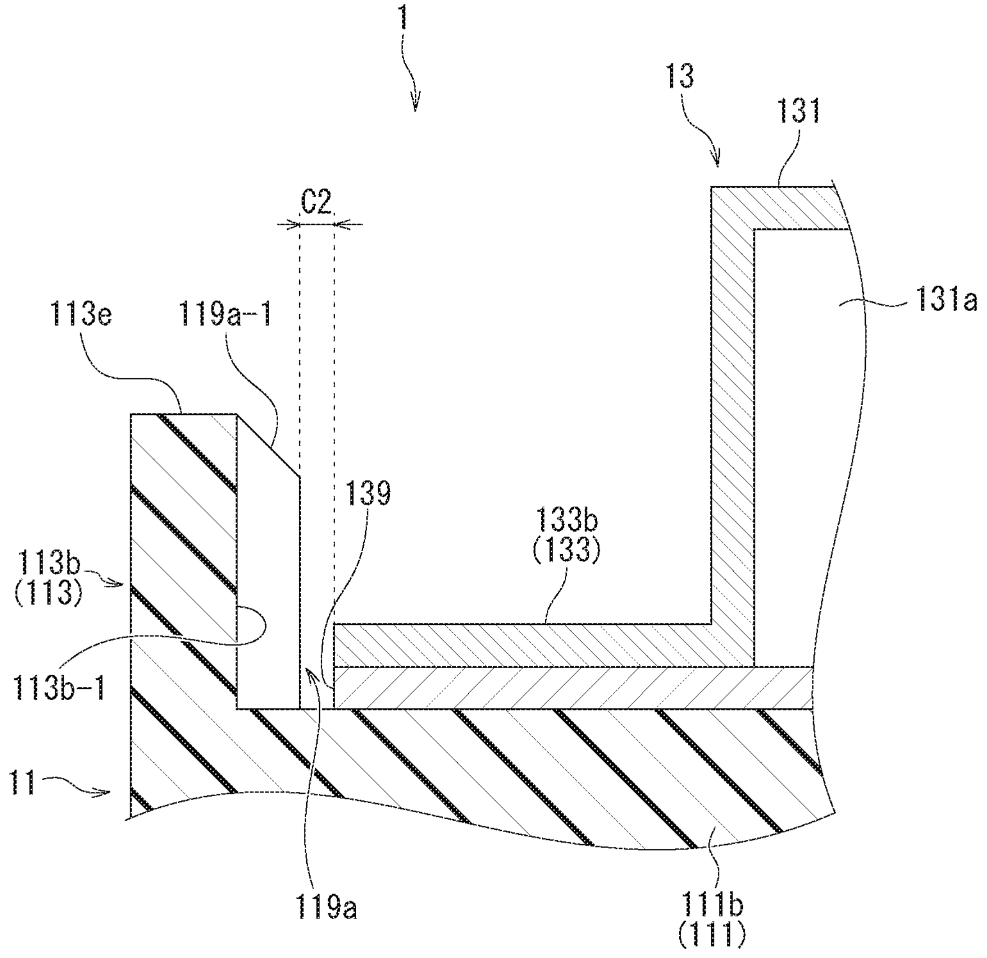
FIG. 4 is a diagram illustrating on an enlarged scale a second protruding portion provided in the semiconductor module according to the embodiment of the present invention and is a sectional view taken along the α-α line illustrated in FIG. 2.

As illustrated in FIG. 4, the second protruding portion 119*a* is formed integrally with the short side portion 113*b* of the side wall 113 provided in the case part 11. The second protruding portion 119*a* is disposed to face the short side portion 133*b* of the peripheral portion 133 provided in the base part 13. The second protruding portion 119*a* is formed to protrude from a facing surface 113*b*-1 of the short side portion 113*b* facing the short side portion 133*b*. The second protruding portion 119*a* is disposed from a surface of the case part 11 bonded to the base part 13 to an end 113*e* of the side wall 113 of the case part 11.

The second protruding portion 119*a* has an inclined surface 119*a*-1 that is inclined to be lower with respect to the side wall 113 of the case part 11 as getting away from the end 113*e* side of the side wall 113 of the case part 11. Therefore, the second protruding portion 119*a* has a rectangular parallelepiped shape with part of its corners missing. The case part 11 is attached to the base part 13 from the end 113*e* side of the side wall 113. With the second protruding portions 119*a*, 119*b* being provided, the distance between the side wall 113 of the case part 11 and the side surface 139 of the base part 13 is reduced. When the case part 11 is attached to the base part 13, the case part 11 is guided to the base part 13 by the inclined surface 119*a*-1 of the second protruding portion 119*a*. Consequently, the case part 11 can be attached to the base part 13 smoothly.

A clearance C2 between the second protruding portion 119*a* and the side surface 139 of the base part 13 is greater than a clearance C1 between the first protruding portion 117 and an inner wall surface 137*a* of the base part 13 defining the through-hole 137. More specifically, the first protruding portion 117, the through-hole 137, and the second protruding portion 119*a* are formed such that the clearance C2 between the second protruding portion 119*a* and a part of the side surface 139 of the base part 13 in the short side portion 133*b* is greater than the clearance C1 between an end 117*b* of the first protruding portion 117 and the inner wall surface 137*a* of the base part 13 defining the through-hole 137. Although not illustrated, a clearance between the second protruding portion 119*b* and the side surface 139 of the base part 13 (more specifically, a part of the side surface 139 in the long side portion 133*c*) is greater than the clearance C1 between the first protruding portion 117 and the inner wall surface 137*a* of the base part 13 defining the through-hole 137.

In this way, by forming the first protruding portion 117, the through-hole 137, and the second protruding portions 119*a*, 119*b* so that the clearances C2 at the second protruding portions 119*a*, 119*b* are greater than the clearance C1 at the first protruding portion 117, the deviation of the case part 11 in the rotational direction using the first protruding portion 117 as the rotational axis can be effectively suppressed when attaching the case part 11 to the base part 13.

(Effects of Semiconductor Module)

Figure 5A:
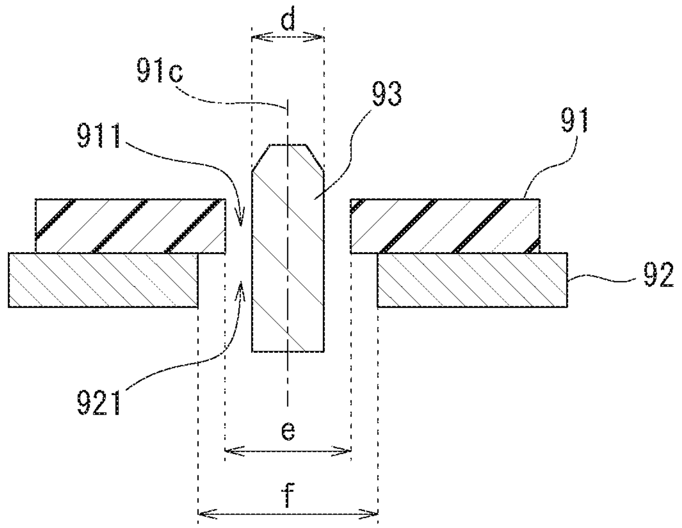
FIGS. 5A and 5B are diagrams for explaining the effects of the semiconductor module according to the embodiment of the present invention and are diagrams illustrating one example of the assembly tolerance of a conventional semiconductor module.
Figure 5B:
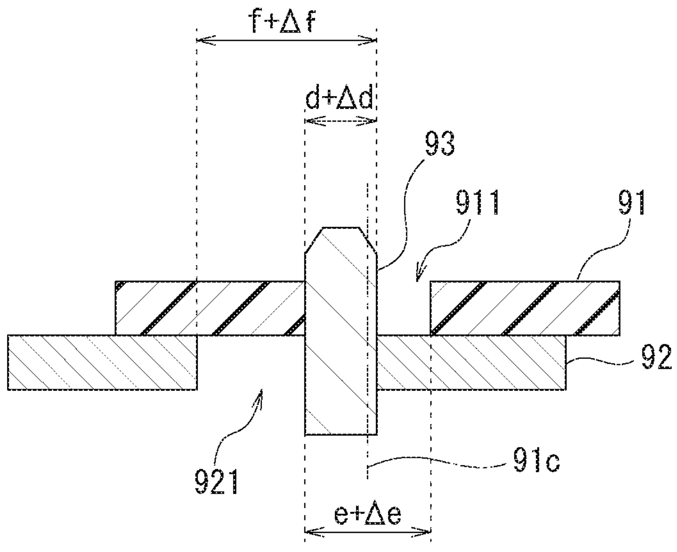

Next, the effects of the semiconductor module 1 according to this embodiment will be described with reference to FIGS. 5A and 5B while also referring to FIG. 3. FIGS. 5A and 5B are diagrams illustrating one example of the assembly tolerance of a conventional semiconductor module. FIG. 5A illustrates a state where a case part 91 and a base part 92 do not deviate with respect to a jig pin 93. FIG. 5B illustrates a state where the case part 91 and the base part 92 deviate with respect to the jig pin 93 so that the case part 91 is most difficult to attach to the base part 92.

As illustrated in FIGS. 5A and 5B, in the conventional semiconductor module, the case part 91 is attached to the base part 92 using as a reference the jig pin 93 provided in an assembly device for assembling the semiconductor module. Specifically, in the conventional semiconductor module, the case part 91 and the base part 92 are positioned by inserting the jig pin 93 into a through-hole 911 formed in the case part 91 and a through-hole 921 formed in the base part 92.

As illustrated in FIG. 5A, it is assumed that a reference value (i.e., a design value) of the dimension of the jig pin 93 is given by "d", that a reference value (i.e., a design value) of the dimension of the through-hole 911 of the case part 91 is given by "e", and that a reference value (i.e., a design value) of the dimension of the through-hole 921 of the base part 92 is given by "f". As illustrated in FIG. 5A, when the dimensions of the jig pin 93, the through-hole 911 of the case part 91, and the through-hole 921 of the base part 92 are respectively the reference values and the case part 91 and the base part 92 do not deviate with respect to the jig pin 93, a cumulative tolerance Tc in the conventional semiconductor module can be expressed by a formula (5) below.

$$\begin{aligned} Tc &= (e-d)+(f-d) \\ &= (e+f)-2\times d \end{aligned} \tag{5}$$

It is assumed that an upper allowable deviation and a lower allowable deviation of the reference value d of the dimension of the jig pin 93 are respectively given by "Δd". It is assumed that an upper allowable deviation and a lower allowable deviation of the reference value e of the dimension of the through-hole 911 of the case part 91 are respectively given by "Δe". It is assumed that an upper allowable deviation and a lower allowable deviation of the reference value f of the dimension of the through-hole 921 of the base part 92 are respectively given by "Δf". As illustrated in FIG. 5B, the relative position of the base part 92 and the case part 91 deviates most from a reference state when the case part 91 and the base part 92 deviate with respect to the jig pin 93 to the sides opposite to each other and the dimension of the jig pin 93 becomes minimum while the dimensions of the case part 91 and the base part 92 respectively become maximum. Herein, the reference state is the state illustrated in FIG. 5A, i.e., the state where the central axes of the jig pin 93, the through-hole 911 of the case part 91, and the through-hole 921 of the base part 92 coincide with each other. Therefore, in the conventional semiconductor module, a maximum cumulative tolerance Tcn when a central position 91*c* of the through-hole 911 of the case part 91 is given as a reference can be expressed by a formula (6) below.

$$\begin{aligned} Tcn &= [e+\Delta e-(d-\Delta d)]+[f+\Delta f-(d-\Delta d)] \\ &= [(e+f)-2\times d]+(\Delta e+\Delta f+2\times\Delta d) \end{aligned} \tag{6}$$

As shown by the formulas (5) and (6), in the conventional semiconductor module, the dimensions of the jig pin 93, the through-hole 911 of the case part 91, and the through-hole 921 of the base part 92 and the relative positional relationship of the jig pin 93, the case part 91, and the base part 92 affect the cumulative tolerance.

In contrast, as described above, in the semiconductor module 1 according to this embodiment, only the dimensions of the first protruding portion 117 formed in the case part 11 and the through-hole 137 formed in the base part 13 affect the cumulative tolerance. In the semiconductor module 1, the first protruding portion 117 serves as the positioning reference. Therefore, for example, it is assumed that the reference value a1 of the dimension of the first protruding portion 117 is equal to the reference value d of the dimension of the jig pin 93. Further, it is assumed that the reference value b1 of the dimension of the through-hole 137 is equal to the reference value f of the dimension of the through-hole 921 of the base part 92. Further, it is assumed that the allowable deviation Δa1 of the reference value a1 of the dimension of the first protruding portion 117 is equal to the allowable deviation Δd of the reference value d of the dimension of the jig pin 93. Further, it is assumed that the allowable deviation Δb1 of the reference value b1 of the dimension of the through-hole 137 is equal to the allowable deviation Δf of the reference value f of the dimension of the through-hole 921 of the base part 92. Then, a difference ΔT between the maximum cumulative tolerance T1*n* in the semiconductor module 1 and the maximum cumulative tolerance Tcn in the conventional semiconductor module can be expressed by a formula (7) below.

$$\begin{aligned} \Delta T &= Tcn - T1n \\ &= [(f-b1)-(2\times d-a1)+e]+[(\Delta f-\Delta b1)+(2\times\Delta d-\Delta a1)+\Delta e] \end{aligned} \tag{7}$$

In the formula (7), "b1=f", "Δb1=Δf", "a1=d", and "Δa1=Δd". Therefore, by rewriting "a1" as "d" and "Δa1" as "Δd", the formula (7) can be expressed as a formula (8) below.

$$\Delta T=(d-\Delta d)+(e+\Delta e) \tag{8}$$

The formula (8) represents a cumulative tolerance of the dimension of the jig pin 93 and the dimension of the through-hole 911 of the case part 91. That is, compared to the maximum cumulative tolerance Tcn in the conventional semiconductor module, the maximum cumulative tolerance T1*n* in the semiconductor module 1 according to this embodiment is reduced by a cumulative tolerance of a member (the jig pin 93 in the formula (8)) that serves as a reference in positioning two members, and one of the two members (the case part 91 in the formula (8)) that is positioned with respect to the member that serves as the reference.

Therefore, compared to the conventional semiconductor module, the semiconductor module 1 can reduce the assembly tolerance between the case part 11 and the base part 13. That is, since the semiconductor module 1 uses the first protruding portion 117 as the positioning reference, it is possible to reduce the assembly tolerance between the case part 11 and the base part 13. Since the semiconductor module 1 can reduce the assembly tolerance between the case part 11 and the base part 13, it is possible to reduce the probability of the occurrence of a failure that the case part 11 cannot be attached to the base part 13. Consequently, it is possible to achieve a reduction in the cost of the semiconductor module 1.

As described above, the semiconductor module 1 according to this embodiment includes: the base part 13 having the plurality of semiconductor elements Su1 to Sw2 and the cooling unit 131 configured to cool the plurality of semiconductor elements Su1 to Sw2; the case part 11 attached to the base part 13 and defining the space 12 in which the plurality of semiconductor elements Su1 to Sw2 is disposed; the first protruding portion 117 having the shape in which the dimension in the first direction L1 passing through the center 117*a* of the first protruding portion 117 and the dimension in the second direction L2 crossing the first direction L1 and passing through the center 117*a* differ from each other, the first protruding portion 117 protruding from the case part 11 toward the side on which the base part 13 is disposed; and the through-hole 137 having the opening being larger than the outer periphery of the first protruding portion 117 and following the shape of the outer periphery of the first protruding portion 117, wherein the through-hole 137 is formed to pass through the base part 13 and the first protruding portion 117 is inserted into the through-hole 137.

Consequently, the semiconductor module 1 can reduce the assembly tolerance between the case part 11 and the base part 13 as the assembly parts.

The present invention is not limited to the embodiment described above, and various modifications can be made.

In the above-described embodiment, the first protruding portion has the rectangular shape as viewed in the direction perpendicular to the surface where the first protruding portion is formed, but the present invention is not limited thereto. The first protruding portion may have another shape (e.g., an oval shape or the like) as long as the shape is not a shape (e.g., a circular shape) in which the dimensions in two directions passing through the center of the first protruding portion and crossing each other (perpendicularly in the above-described embodiment) are equal to each other as viewed in the direction perpendicular to the surface where the first protruding portion is formed.

In the above-described embodiment, the second protruding portion has the rectangular parallelepiped shape with part of its corners missing, but the present invention is not limited thereto. For example, the second protruding portion may have a hemispherical shape, a triangular prism shape, a truncated pyramid shape, a circular truncated cone shape, or the like.

The technical scope of the present invention is not limited to the illustrated and described exemplary embodiments, and also includes all embodiments that provide advantageous effects equivalent to those intended by the present invention. Further, the technical scope of the present invention is not limited to combinations of the features of the invention defined by the claims, and can be defined by any desired combination of specific features among all the disclosed features.

REFERENCE SIGNS LIST

1 semiconductor module
11, 91 case part
12 space
13, 92 base part
**14*u*** U-phase laminated substrate
**14*v*** V-phase laminated substrate
**14*w*** W-phase laminated substrate
**91*c*** central position
93 jig pin
111, 133 peripheral portion
**111*a*, 111*b*, 113*a*, 113*b*, 133*a*, 133*b*** short side portion
**111*a*-1** surface
**111*c*, 111*d*, 113*c*, 113*d*, 133*c*, 133*d*** long side portion
112 board mounting hole
113 side wall
**113*b*-1** facing surface
**113*e*, 117*b*** end
**114*a*, 114*b*** partition
115 columnar portion
117 first protruding portion
**117*a*** center
**119*a*, 119*b*** second protruding portion
**119*a*-1** inclined surface
**121*u*** U-phase space
**121*v*** V-phase space
**121*w*** W-phase space
131 cooling unit
**131*a*** storage space
132 board mounting hole
**135*a*, 135*b*** inlet/outlet port
137, 911, 921 through-hole
**137*a*** inner wall surface
139 side surface
a1, a2, b1, b2, d, e, f reference value
C1, C2 clearance
L1 first direction
L2 second direction
Nu, Nv, Nw negative electrode terminal
Ou, Ov, Ow output terminal
Pu, Pv, Pw positive electrode terminal
Su1, Su2, Sv1, Sv2, Sw1, Sw2 semiconductor element
T1, T**1*n*, T2, T2*n***, Tc, Tcn cumulative tolerance
Δa1, Δb1, Δd, Δf allowable deviation
ΔT difference

The invention claimed is:

1. A semiconductor module comprising:
a base part having:
a plurality of semiconductor elements,
a cooling unit configured to cool the plurality of semiconductor elements,
a rectangular shape with a pair of short sides, a pair of long sides, and four corners in a plan view, and
a through-hole closer to a first short side of the pair of short sides than to both long sides of the pair of long sides; and
a case part attached to the base part and having:
a peripheral portion having a rectangular frame shape,
a partition that partitions inside of the peripheral portion to define a space in which the plurality of semiconductor elements are disposed,
a side wall that extends from the peripheral portion and that surrounds the base part,
a first protruding portion protruding from the peripheral portion toward a main surface of the base part and inserted into the through-hole, and
a pair of second protruding portions protruding from the side wall toward a side surface of the base part,
wherein the first protruding portion has an outer periphery that follows a shape of an inner periphery of the through-hole, the outer periphery having a clearance from the inner periphery of the through-hole,
the pair of second protrusions are opposite to a second short side of the pair of short sides and a first long side of the pair of long sides, respectively, such that the pair of second protrusions sandwich a corner located diagonal to one corner of the four corners of the base part that is closest to the through-hole, and a clearance between each second protruding portion of the pair of second protruding portions and the side surface of the base part is greater than the clearance from the inner periphery of the through-hole.

2. The semiconductor module according to claim 1, wherein the first protruding portion has a shape in which a dimension along one of the pair of long sides of the base part is longer than a dimension along one of the pair of short sides of the base part.

3. The semiconductor module according to claim 2, wherein the pair of second protruding portions each have an inclined surface inclined to be lower with respect to the side wall of the case part away from an end side of the side wall of the case part.

4. The semiconductor module according to claim 3, wherein a clearance between each second protruding portion of the pair of second protruding portions and the side surface of the base part is greater than the clearance between the first protruding portion and the through-hole.

5. The semiconductor module according to claim 2, wherein a clearance between each second protruding portion of the pair of second protruding portions and the side surface of the base part is greater than the clearance between the first protruding portion and the through-hole.

6. The semiconductor module according to claim 1, wherein the pair of second protruding portions each have an inclined surface inclined to be lower with respect to the side wall of the case part away from an end side of the side wall of the case part.

7. The semiconductor module according to claim 6, wherein the first protruding portion has a shape in which a dimension along one of the pair of long sides of the base part is longer than a dimension along one of the pair of short sides of the base part.

8. The semiconductor module according to claim 7, wherein a clearance between each second protruding portion of the pair of second protruding portions and the side surface of the base part is greater than the clearance between the first protruding portion and the through-hole.

9. The semiconductor module according to claim 6, wherein a clearance between each second protruding portion of the pair of second protruding portions and the side surface of the base part is greater than the clearance between the first protruding portion and the through-hole.

10. The semiconductor module according to claim 1, wherein dimensions of the through-hole in two directions, each passing through a center of the through-hole and crossing each other in the plan view, are not equal, and dimensions of the first protruding portion in two directions, each passing through a center of the first protruding portion and crossing each other in the plan view, are not equal.

* * * * *